(12) United States Patent
Min et al.

(10) Patent No.: US 11,706,994 B2
(45) Date of Patent: Jul. 18, 2023

(54) ELECTRIC FIELD CONTROLLED MAGNETORESISTIVE RANDOM-ACCESS MEMORY

(71) Applicant: KOREA INSTITUTE OF SCIENCE AND TECHNOLOGY, Seoul (KR)

(72) Inventors: Byoung-Chul Min, Seoul (KR); Jun Woo Choi, Seoul (KR); Hee Gyum Park, Gyeonggi-do (KR)

(73) Assignee: KOREA INSTITUTE OF SCIENCE AND TECHNOLOGY

( * ) Notice: Subject to any disclaimer, the term of this patent is extended or adjusted under 35 U.S.C. 154(b) by 260 days.

(21) Appl. No.: 15/930,892

(22) Filed: May 13, 2020

(65) Prior Publication Data
US 2020/0381614 A1 Dec. 3, 2020

(30) Foreign Application Priority Data
May 30, 2019 (KR) .................. 10-2019-0063575

(51) Int. Cl.
*H10N 50/80* (2023.01)
*H10B 61/00* (2023.01)
*H10N 50/85* (2023.01)

(52) U.S. Cl.
CPC ............ *H10N 50/80* (2023.02); *H10B 61/22* (2023.02); *H10N 50/85* (2023.02)

(58) Field of Classification Search
CPC ....... H01L 43/02; H01L 43/10; H01L 27/228; H10N 50/80; H10N 50/85; H10N 50/10; H10N 30/30; H10B 61/22; G11C 11/1659; G11C 11/1675; G11C 11/161; G11C 11/1673
See application file for complete search history.

(56) References Cited

U.S. PATENT DOCUMENTS

| 6,473,337 | B1 * | 10/2002 | Tran ...................... G11C 11/161 365/158 |
| 10,199,083 | B1 * | 2/2019 | Bozdag .................. B82Y 25/00 |
| 10,971,545 | B2 * | 4/2021 | Aggarwal ............. H01L 23/528 |
| 2005/0207071 | A1 * | 9/2005 | Sato ........................ B82Y 40/00 |
| 2014/0061828 | A1 * | 3/2014 | Lim .................... G11C 11/1659 257/421 |
| 2016/0049184 | A1 * | 2/2016 | Ranjan ................ G11C 11/1675 365/158 |

(Continued)

*Primary Examiner* — Marc Anthony Armand
(74) *Attorney, Agent, or Firm* — Mendelsohn Dunleavy, P.C.

(57) ABSTRACT

Disclosed is an electric field-controlled magnetoresistive random-access memory (MRAM) including memory cells. The memory cell has a heterogenous double tunnel junction structure including a first tunnel junction and a second tunnel junction. The first tunnel junction includes a magnetic tunnel junction layer having a magnetization direction that changes according to spin transfer torque when an external voltage is applied, and the second tunnel junction includes an electric-field control layer that controls an electric field applied to the magnetic tunnel junction layer to induce a change in magnetic anisotropy within the magnetic tunnel junction layer. The heterogeneous tunnel junction structure combines electric field-controlled magnetic anisotropy and spin transfer torque to enable low power driving of memory cells, thereby enabling a high energy-efficient electric field-controlled MRAM.

18 Claims, 8 Drawing Sheets

(56) References Cited

U.S. PATENT DOCUMENTS

2016/0064650 A1\* 3/2016 Wang ................. H10N 50/10
  257/427
2020/0091408 A1\* 3/2020 Sundar ................ H01L 43/02

\* cited by examiner

FIG. 3A (a) before writing

FIG. 3B (a) during writing

FIG. 3C (a) after writing

ELECTRIC FIELD CONTROLLED MAGNETORESISTIVE RANDOM-ACCESS MEMORY

STATEMENT OF GOVERNMENTAL SUPPORT

This invention was made with government support under Project No. CAP-16-01-KIST awarded by Creative Allied Project (CAP) Program through the National Research Council of Science & Technology (NST) funded by the Ministry of Science and ICT. The government support was made at a contribution rate of 1/1 for the research period of Jul. 1, 2016 through Jun. 30, 2019. The supervising institute was KOREA INSTITUTE OF SCIENCE AND TECHNOLOGY.

CROSS REFERENCE TO RELATED APPLICATION

The present application claims priority to Korean Patent Application No. 10-2019-0063575, filed May 30, 2019, the entire contents of which is incorporated herein for all purposes by this reference.

BACKGROUND OF THE DISCLOSURE

1. Field of the Invention

The present disclosure relates to a magnetoresistive random-access memory (MRAM) and, more particularly, to an electric field-controlled MRAM having a heterogeneous tunnel junction structure that combines electric field-controlled magnetic anisotropy and spin transfer torque so as to be driven at lower power consumption.

2. Description of the Background Art

Random-access memories (RAMs) are widely used as storage devices for storing various kinds of information in electronic devices. New technologies have been proposed to compensate for the shortcomings of DRAMs or SRAMs, which are currently widely used storage devices. One of them is a magnetoresistive random-access memory (MRAM) which is also called a magnetic RAM.

An MRAM uses a resistance variable element having a magnetic tunnel junction (MTJ) structure as a memory cell that stores information. The magnetic tunnel junction is typically configured with a three-layer structure composed of a fixed magnetic layer, a nonmagnetic layer, and a free magnetic layer. When the magnetization directions of the magnetic layers disposed on the respective sides of the nonmagnetic layer are parallel, the magnetic tunnel junction has a low resistance. By contrast, when the magnetization directions of the magnetic layers are anti-parallel, the magnetic tunnel junction has a high resistance.

These low and high resistance states are represented as digital signals 0 and 1, respectively. In this way, digital information is stored and processed. To write information in an MRAM, the magnetization of a free magnetic layer is controlled by using a spin transfer torque (STT). This method is characterized in that the magnetization direction can be controlled in a manner that electrons that are spin-polarized by the fixed magnetic layer in the magnetic tunnel junction structure transfer the spin angular momentum to the free magnetic layer through the nonmagnetic layer.

The MRAM according to the related art has problems described below. As the size of the magnetic tunnel junction becomes smaller, the magnetic layer in which information is stored is susceptible to change in the magnetization direction due to thermal fluctuations, resulting in that the stored information is likely to be accidently lost.

To prevent this, it is necessary to keep magnetic anisotropy energy KV (where K is the density of anisotropy energy and V is the volume of a memory cell) higher than thermal energy $k_B T$ (where $k_B$ is the Boltzmann constant and T is temperature).

However, there is a problem that the amount of current or energy required for switching of the magnetization direction increases with the magnetic anisotropy energy, KV. In a case where the amount of current or energy required to reverse the magnetization direction increases, the power consumption for driving an electronic device in which the MRAM is mounted increases, and it is difficult to design a driving circuit for driving the MRAM.

In general, in order to configure a memory device using magnetic tunnel junction elements, a transistor is provided for each of the magnetic tunnel junction elements. Since the current that can be driven by one transistor is limited depending on the size of the transistor, the transistor needs to be increased in size to allow more current to flow through the transistor.

This problem not only causes an increase in power consumption for driving memory elements but also negatively affects the integration of the memory elements. Therefore, it is required to reduce the amount of current or the magnitude of energy required to reverse a magnetization direction of a magnetic tunnel junction element.

DOCUMENT OF RELATED ART

Patent Document
(Patent Document 1) U.S. Pat. No. 7,057,921 (Jun. 6, 2006)
(Patent Document 2) European Patent No. 1103079 (May 30 2001)
Non-patent Document
(Non-patent Document 1) Suzuki, T. Maruyama et al., Nat. Nanotechnol. 4, 158-161 (2009)
(Non-patent Document 2) U. Bauer et al., Nat. Mater. 14, 174-181 (2015)
(Non-patent Document 3) T. Bonaedy J. Phys. D: Appl. Phys. 48 225002 (2015)
(Non-patent Document 4) Double MTJ Grandis: Diao, Appl. Phys. Lett 90, 132508 (2007)

SUMMARY OF THE DISCLOSURE

The present disclosure has been made to solve the problems occurring in the related art and an objective of the present disclosure is to provide an electric field-controlled magnetoresistive random-access memory (MRAM) having a heterogeneous tunnel junction structure and combining electric field-controlled magnetic anisotropy and spin transfer torque, the MRAM being driven at low power consumption and exhibiting high energy efficiency.

In order to accomplish the objective of the present disclosure, one aspect of the present disclosure provides an electric field-controlled magnetoresistive random-access memory (MRAM) including at least one memory cell having a heterogeneous tunnel junction structure composed of a first tunnel junction and a second tunnel junction, the first tunnel junction including a magnetic tunnel junction layer whose magnetization direction changes according to spin transfer torque when a voltage is externally applied to the first tunnel junction, and the second tunnel junction including an electric-field control layer configured to control an electric field applied to the magnetic tunnel junction layer when a voltage is externally applied to the second tunnel junction, thereby inducing a change in magnetic anisotropy in the magnetic tunnel junction layer.

The MRAM may include: a first electrode layer electrically connected to an external device; a first magnetic layer provided on one surface of the first electrode layer and having a magnetization direction that is fixed; a second magnetic layer having a magnetization direction that can be manipulated, thereby providing magnetic information; a first insulating layer provided between the first magnetic layer and the second magnetic layer and serving as a tunnel barrier; a second insulating layer provided on one surface of the second magnetic layer and configured to undergo spontaneous electric polarization when an electric field applied thereto; and a second electrode layer provided on one surface of the second insulating layer and connected to an external device, in which the magnetic tunnel junction layer of the first tunnel junction comprises the second magnetic layer, the first insulating layer, and the first magnetic layer arranged in this order, and the second tunnel junction comprises the second electrode layer, the second insulating layer, and the second magnetic layer arranged in this order, the second insulating layer serving as an electric-field control layer.

Each of the first electrode layer and the second electrode layer may be made of any one metal selected from the group consisting of Hf, Ta, W, Re, Os, Ir, Pt, Au, Y, Zr, Nb, Mo, Ru, Th, Pd, Ag, In, Sn, Ti, V, Cr, Mn, Fe, Co, Ni, Cu, Zn, Mg, Al, and Si, a metal alloy based on the any one metal, a metal nitride based on the any one metal, or a combination of the any one metal and the metal nitride.

In order to fix the magnetization direction of the first magnetic layer, the first magnetic layer may be made of a material having a higher magnetic anisotropy energy or a larger coercive force than the second magnetic layer.

Each of the first magnetic layer and the second magnetic layer may contain FeX, CoX, NiX, FeCoX, CoNiX, or NiFeX (where X is at least one element selected from the group consisting of B, Re, Rh, Cr, Cu, Pt, Pd, Gd, and Tb).

In order for each of the first magnetic layer and the second magnetic layer to have a magnetization direction that is perpendicular to a thin film surface, each of the first magnetic layer and the second magnetic layer may use: a face-centered tetragonal (FCT) metal alloy selected from among FePT, CoPt, FePd, and MnAl; a metal alloy with a hexagonal close-packed (HCP) structure, selected from among $Co_3Pt$ and CoCrPt; a rare earth transition metal alloy selected from among $Fe_{14}Nd_2B$ and $SmCo_5$; an interfacial magnetic anisotropy occurring at an CoFeB/MgO interface; or a multilayer thin film selected from among [Co/Pt]n, [CoX alloy/Pt]n, [Co/Pd]n, [CoX alloy/Pd]n, [Co/Ni]n, [CoX alloy/Ni]n, and [Ni/Pt]n (where n is an integer between 1 to 10 and X is a metal selected from the group consisting of Fe, Ni, Cr, Ru, Re, Rh, Gd, and Tb).

The first magnetic layer may use a material formed through exchange coupling between an anti-ferromagnet and a ferromagnet or a synthetic anti-ferromagnetic material composed of a magnetic layer, a nonmagnetic metal layer, and a magnetic layer arranged in this order, and the second magnetic layer may be a synthetic-free magnetic layer composed of a magnetic layer, a nonmagnetic layer, and a magnetic layer arranged in this order.

The first insulating layer may be made of a first type of metal oxide selected from among MgO, $Al_2O_3$, and $TiO_2$ or a second type of metal oxide including two or more kinds of metal cations and being selected from among $MgAl_2O_4$ and $MgGa_2O_4$.

The first insulating layer may have a thickness within a range from 0.7 nm to 2 nm.

The first tunnel junction may have a higher resistance than that of the second tunnel junction so that a resistance and a magnetoresistance ratio of the memory cell is determined by the first tunnel junction.

Coherent tunneling may be induced by matching a crystal orientation of the first insulating layer with crystal orientations of the first magnetic layer and the second magnetic layer.

The second insulating layer may be made of a ferroelectric material.

The second insulating layer may be made of $HfO_2$ doped with at least one element selected from the group consisting of Zr, Y, Si, Al, Gd, Tb, Yb, Sr, and La, or $ZrO_2$ doped with at least one element selected from the group consisting of Y, Si, Al, Gd, Tb, Yb, Sr, and La, or MgO doped with at least one element selected from the group consisting of Hf, Zr, Y, Si, Al, Gd, Tb, Yb, Sr, La, Ir, Pt, Ru, Ta, Mo, Ti, Zn, and Ga, in which the second insulating layer has an orthorhombic structure.

The MRAM may further include a work-function control layer interposed between the second insulating layer and the second electrode layer to reduce a resistance of the second tunnel junction.

The work-function control layer may be made of a metal having a work function less than 4 eV and being selected from the group consisting of Mg, Sc, Sr, Y, Ba, La, Hf, Ce, Nd, Sm, Eu, Gd, Tb, Dy, Ho, Er, Tm, Yb, and Lu.

The work-function control layer may be prepared by forming an insertion layer doped with at least one element selected from the group consisting of Zr, Y, Si, Al, Gd, Sr, and La or at least one element selected from the group consisting of Zr, Y, Si, Al, Gd, Sr, and La on an $HfO_2$ layer so that a portion of substances of the insertion layer diffuses into the $HfO_2$ layer, thereby causing spontaneous electric polarization to occur in the second insulating layer.

The MRAM may further include a third electrode layer that is connected to the second magnetic layer and via which a voltage is connected to the first tunnel junction or the second tunnel junction.

The third electrode layer may be formed through steps of etching the first insulating layer, selectively etching the second magnetic layer, and forming the third electrode layer on the remaining second magnetic layer, or steps of etching the first insulating layer and locally doping the second magnetic layer to locally remove a magnetic property from the second magnetic layer, or steps of etching the first insulating layer and forming a locally modified second magnetic layer by converting a magnetic property of a portion of the second magnetic layer.

The MRAM may include an array of the memory cells that are arranged to be collectively driven, and wherein information is selectively read out of and written into the memory cells.

The present disclosure provides a magnetoresistive RAM (MRAM) having a heterogeneous tunnel junction structure in which an electric-field control layer is provided as one tunnel junction that improves an electric field control effect and a magnetic tunnel junction layer is provided as the other tunnel junction that provides high magnetoresistance ratio. That is, the present disclosure combines electric field-controlled magnetic anisotropy and spin transfer torque, thereby enabling low power operation and high energy efficiency of the MRAM.

According to the present disclosure, it is possible to write information by switching the magnetization direction with a small current or energy by temporarily lowering the energy barrier that determines the stability of information by using an electric field during the writing operation, and to improve reliability of retention of information during the non-writing operation.

In addition, according to the present disclosure, with the presence of the work-function control layer, it is possible to reduce the resistance of the magnetic tunnel junction and to facilitate the electric polarization of the electric-field control layer, thereby increasing the effect of the electric field-controlled magnetic anisotropy.

In addition, according to the present disclosure, with the presence of the third electrode layer, a relatively thick electric-field control layer can be used. This thick relatively thick electric-field control layer reliably diminishes the flow of an electric current (electric conduction), thereby reducing energy consumption of a memory cell and allowing the application of a high voltage. Therefore, the present disclosure has an advantage of maximizing the effect of electric field-controlled magnetic anisotropy.

DETAILED DESCRIPTION OF THE DISCLOSURE

The present disclosure relates to an electric field-controlled magnetoresistive RAM (MRAM) having a heterogeneous tunnel junction structure in which one tunnel junction includes an electric-field control layer to improve magnetic anisotropy controlled by an electric field and the other tunnel junction includes a magnetic tunnel junction layer to provide a high magnetoresistance ratio. Thus, the MRAM can store information by switching a magnetization direction with low energy consumption and can reliably retain the stored information.

Figure 1A:
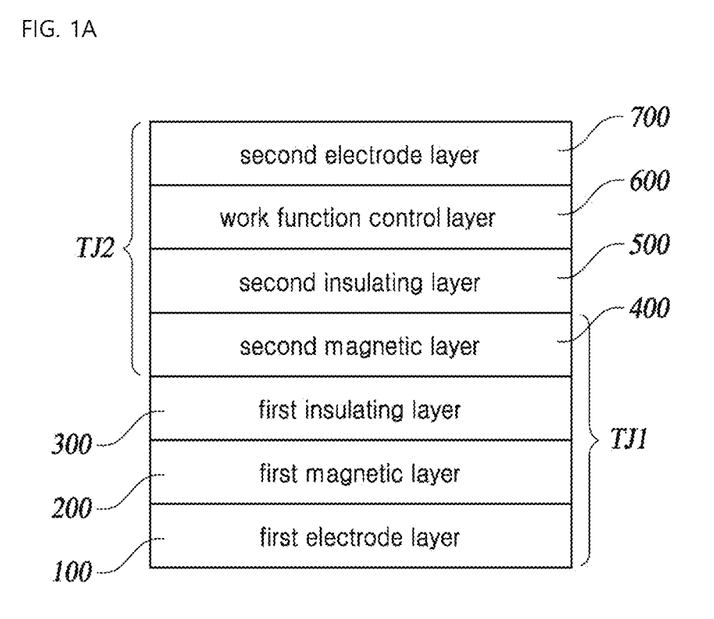
FIGS. 1A and 1B are views schematically illustrating the construction of a magnetoresistive RAM (MRAM) according to an embodiment of the present disclosure.
Figure 1B:
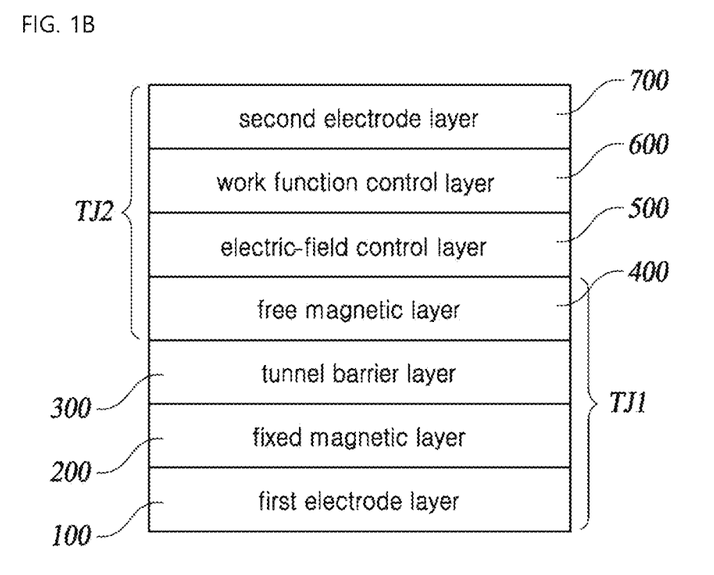
Figure 2A:
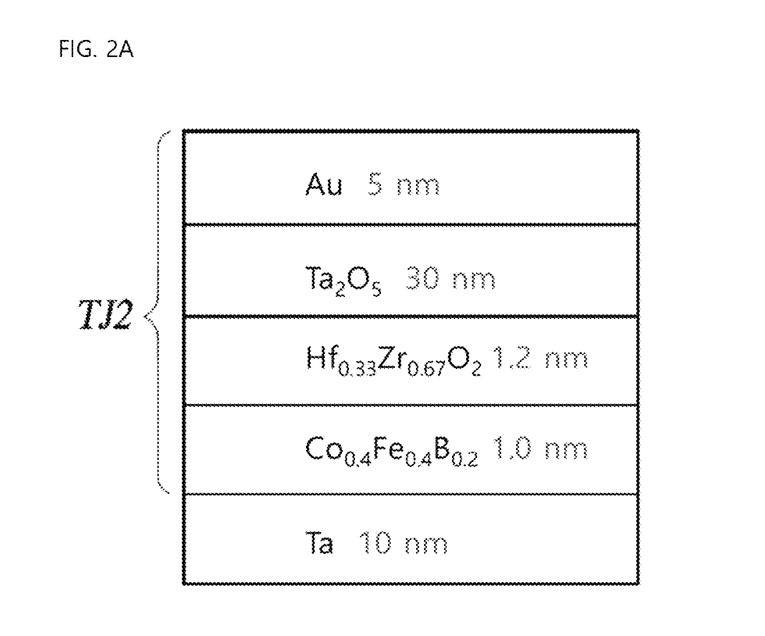
FIGS. 2A is a view illustrating the construction of a second tunnel junction of the MRAM according to an embodiment of the present disclosure, and 2B and 2C are views illustrating the characteristic of the second tunnel junction in which magnetic anisotropy changes with an electric field applied thereto and which is measured with a magneto-optical microscope.
Figure 3A:
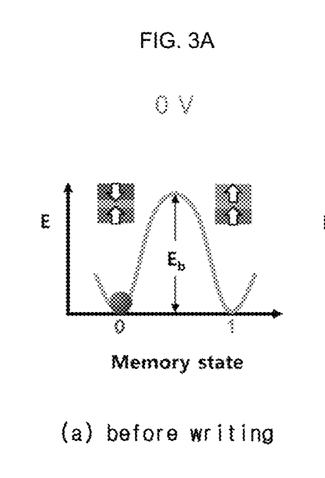
FIGS. 3A, 3B, and 3C are views schematically illustrating a magnetic information recording scheme in which energy profile change with an applied electric field in the MRAM according to one embodiment of the present disclosure.
Figure 3B:
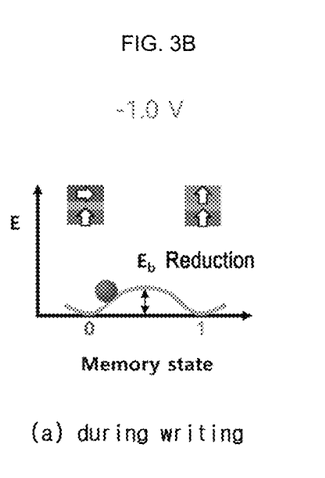
Figure 3C:
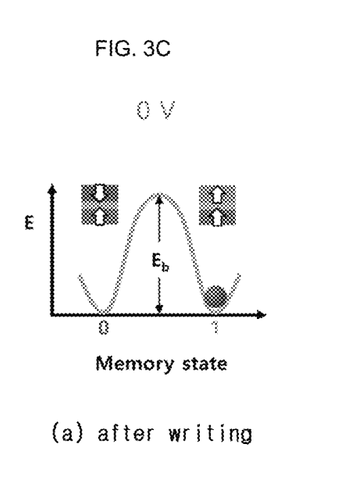
Figure 4A:
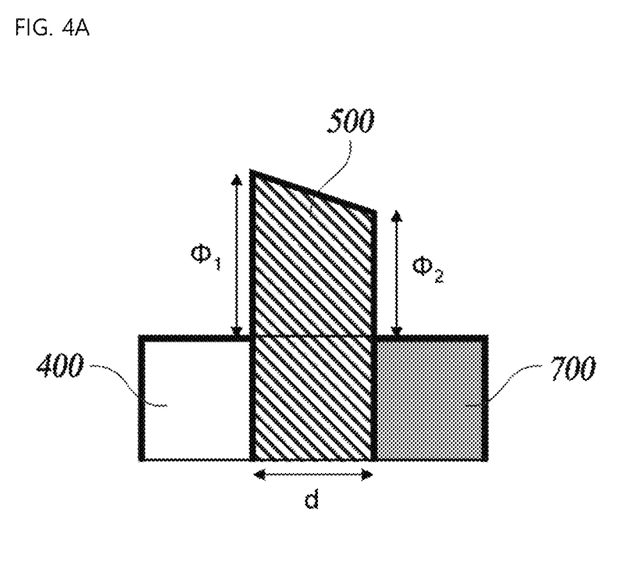
FIGS. 4A and 4B are diagrams schematically illustrating the function of a work-function control layer in an MRAM according to another embodiment of the present disclosure.
Figure 4B:
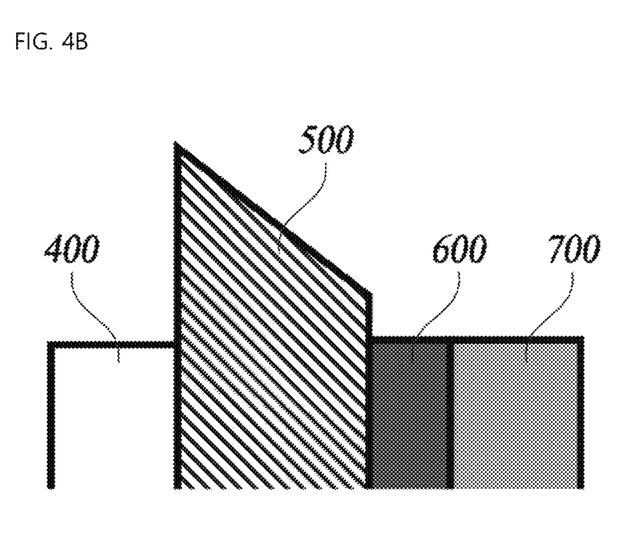
Figure 5:
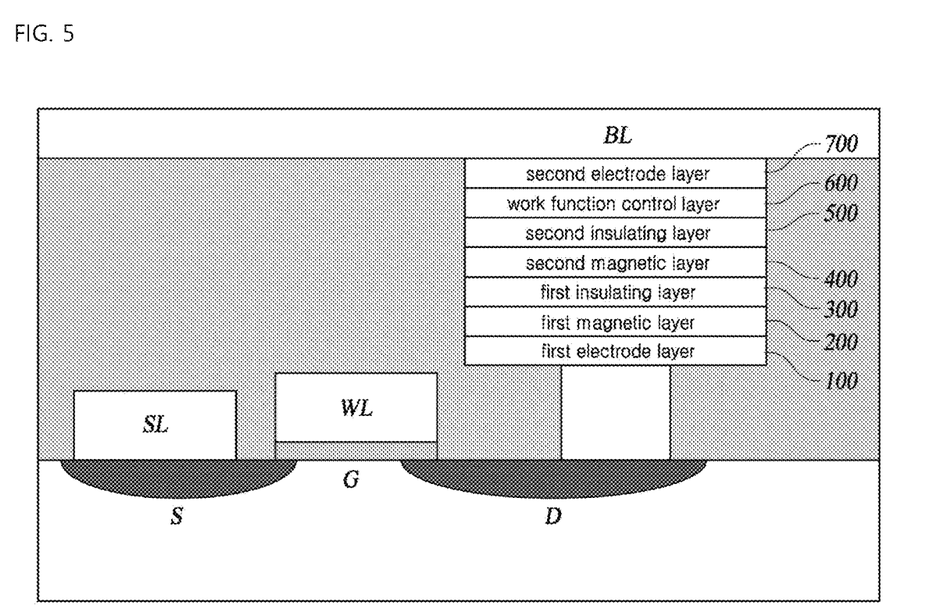
FIG. 5 is a schematic diagram illustrating the architecture of the MRAM in which a memory cell is connected to a transistor, according to one embodiment of the present disclosure.
Figure 6:
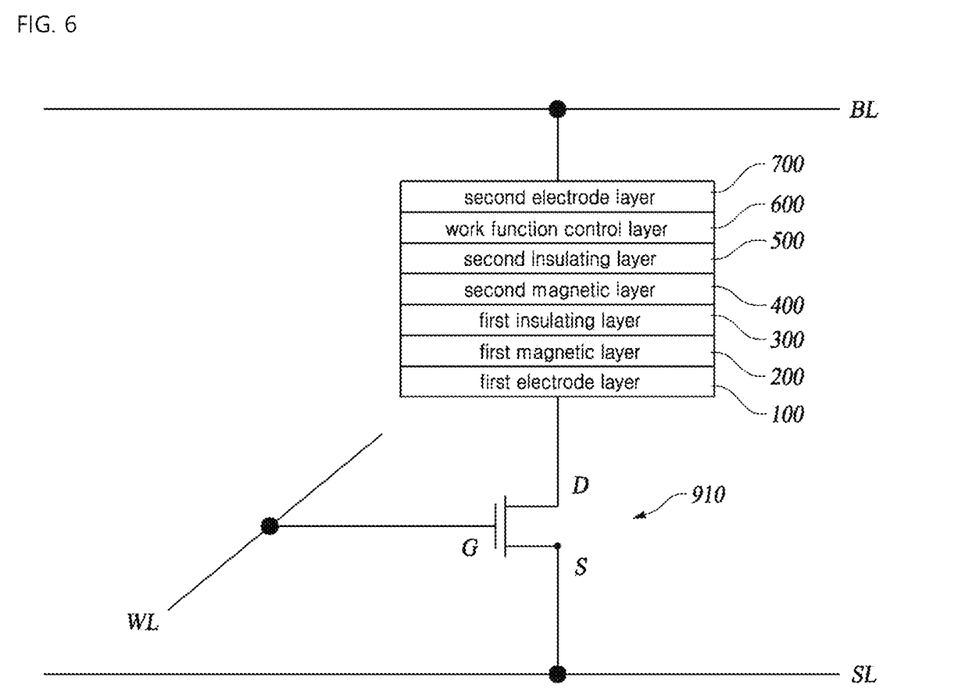
FIG. 6 is a diagram illustrating a method of driving the MRAM in which a memory cell is connected to a transistor.
Figure 7:
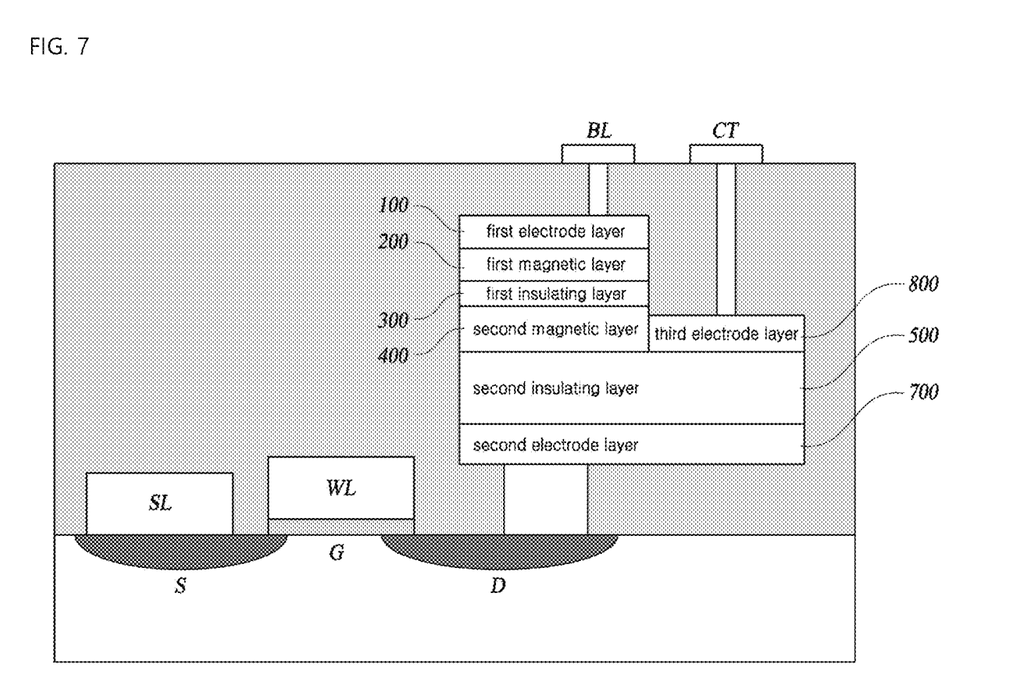
FIG. 7 is a diagram schematically illustrating the architecture of an MRAM in which a memory cell with three electrode layers is connected to a transistor, according to another embodiment of the present disclosure.
Figure 8:
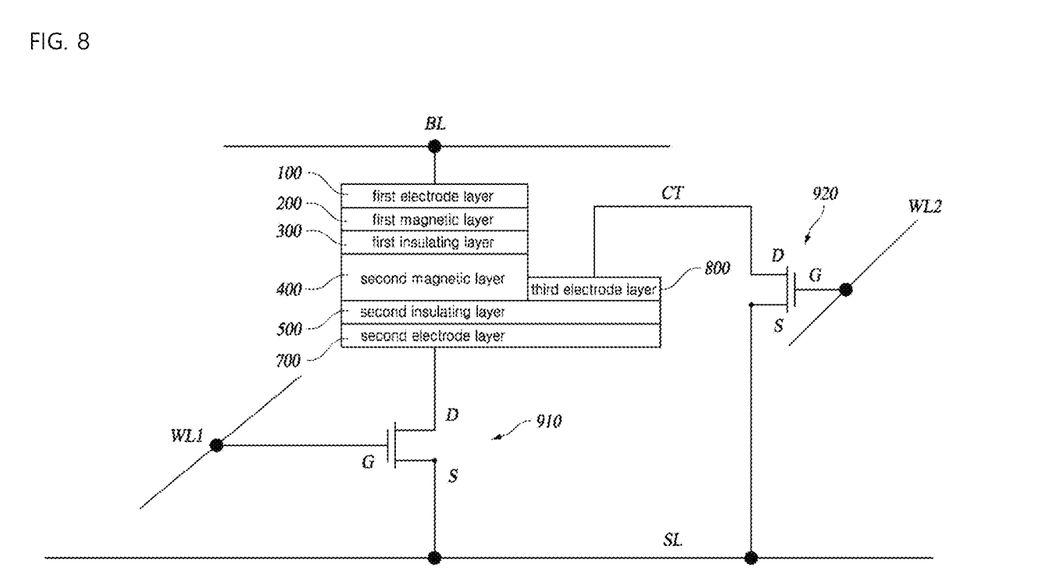
FIG. 8 is a diagram illustrating a method of driving the MRAM in which a memory cell with three electrode layers is connected to a transistor.
Figure 9:
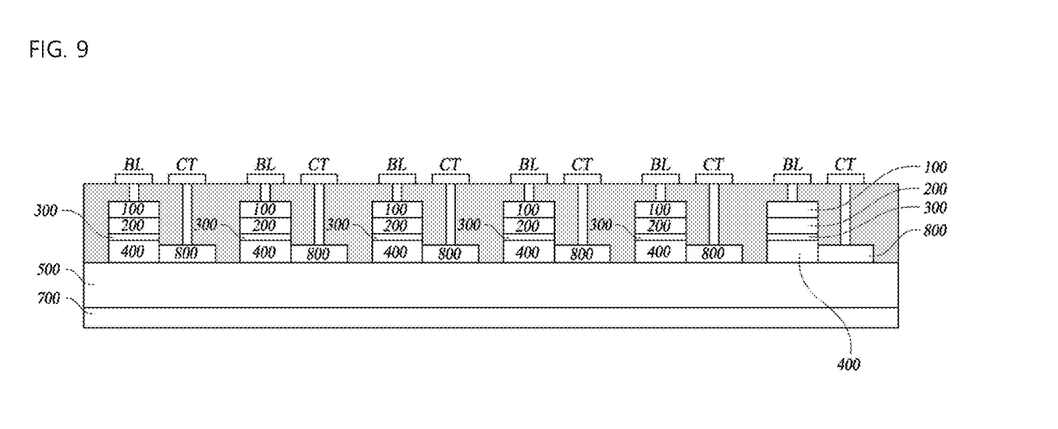
FIG. 9 is a schematic view illustrating the architecture of an MRAM in which a plurality of memory cells, each cell being provided with three electrode layers, is arranged, according to a further embodiment of the present disclosure.

Hereinafter, embodiments of the present disclosure will be described in detail with reference to the accompanying drawings. FIGS. 1A and 1B are views schematically illustrating the construction of a magnetoresistive RAM (MRAM) according to an embodiment of the present disclosure; FIGS. 2A is a view illustrating the construction of a second tunnel junction of the MRAM according to an embodiment of the present disclosure, and 2B and 2C are views illustrating the characteristic of the second tunnel junction in which magnetic anisotropy changes with an electric field applied thereto and which is measured with a magneto-optical microscope; FIGS. 3A, 3B, and 3C are views schematically illustrating a magnetic information recording scheme in which energy profile change with an applied electric field in the MRAM according to one embodiment of the present disclosure; FIGS. 4A and 4B are diagrams schematically illustrating the role of a work-function control layer in an MRAM according to another embodiment of the present disclosure; FIG. 5 is a schematic diagram illustrating the architecture of the MRAM in which a memory cell is connected to a transistor, according to one embodiment of the present disclosure; FIG. 6 is a diagram illustrating a method of driving the MRAM in which a memory cell is connected to a transistor; FIG. 7 is a diagram schematically illustrating the architecture of an MRAM in which a memory cell with three electrode layers is connected to a transistor, according to another embodiment of the present disclosure; FIG. 8 is a diagram illustrating a method of driving the MRAM in which a memory cell with three electrode layers is connected to a transistor; and FIG. 9 is a schematic view illustrating the architecture of an MRAM in which a plurality of memory cells, each cell being provided with three electrode layers, is arranged, according to a further embodiment of the present disclosure.

Referring to FIGS. 1A and 1B, an MRAM according to a first embodiment of the present disclosure includes memory cells. Each memory cell includes a heterogeneous tunnel junction composed of a first tunnel junction TJ1 and a second tunnel junction TJ2. The first tunnel junction includes a magnetic tunnel junction layer having a magnetization direction that changes according to spin transfer torque when a voltage is externally applied. The second tunnel junction TJ2 includes an electric-field control layer 500 that controls an electric field applied to the magnetic tunnel junction layer when a voltage is externally applied thereto, thereby inducing a change in magnetic anisotropy within the magnetic tunnel junction.

That is, the present disclosure is configured with a double tunnel junction in which one tunnel junction is provided with the electric-field control layer 500 that improves magnetic anisotropy for control of an electric field and the other tunnel junction is provided with the magnetic tunnel junction layer that provides a high magnetoresistance ratio.

According to the embodiment of the present disclosure, the memory cell of the MRAM includes a first electrode layer 100, a first magnetic layer 200, a first insulating layer 300, a second magnetic layer 400, a second insulating layer 500, and a work-function control layer 600.

The magnetic tunnel junction layer of the first tunnel junction TJ1 has a multilayer structure composed of the second magnetic layer 400, the first insulating layer 300, and the first magnetic layer 200 arranged in this order. The second tunnel junction TJ2 has a multilayer structure composed of the second electrode layer 700, the second insulating layer 500, and the second magnetic layer 400 arranged in this order, in which the second insulating layer corresponds to the electric-field control layer 500.

In the embodiment of the present disclosure illustrated in FIGS. 1A and 1B, on the upper side of the first electrode layer 100, the first magnetic layer 200, the first insulating layer 300, the second magnetic layer 400, the second insulating layer 500, the work-function control layer 600, and the second electrode layer 700 are stacked in this order. That is, a thin film stack (i.e., the second electrode layer, the work-function control layer, the second insulating layer, the second magnetic layer, the first insulating layer, the first magnetic layer, and the first electrode layer that are arranged in this order) is formed. Alternatively, those layers in the thin film stack may be arranged in reverse order, depending on the application or use of a memory device. That is, a multilayer structure "the first magnetic layer 200/the first insulating layer 300/the second magnetic layer 400/the second insulating layer 500/the work-function control layer 600/the second electrode layer 700" may be formed. The work-function control layer 600 may be omitted as necessary. In order to drive the MRAM, the memory cells, each being structured as described above, are connected to transistors, respectively.

As one embodiment of the present disclosure, a case where a memory cell has a structure in which the first electrode layer 100 is formed at the bottom thereof will be described.

The first electrode layer 100 is connected to an external device, thereby delivering an electric current supplied from an external power supply to the memory cells so that the first magnetic layer 200 can have the structural and magnetic properties that are required.

The first electrode layer 100 is made of any one metal selected from among Hf, Ta, W, Re, Os, Ir, Pt, Au, Y, Zr, Nb, Mo, Ru, Th, Pd, Ag, In, Sn, Ti, V, Cr, Mn, Fe, Co, Ni, Cu, Zn, Mg, Al, and Si. Alternatively, the first electrode layer 100 may be made of a metal alloy (for example, $Ta_xW_{1-x}$) or a metal nitride (for example, TaN) each of which is based on any metal selected from the metals described above. Further alternatively, the first electrode layer 100 may be a combination of a metal and a metal nitride in which the metal is any one metal selected from among the metals described above. In this case, for example, the first electrode layer 100 may be a multilayer structure of Ta/CuN/Ta.

The first magnetic layer 200 is formed on the first electrode layer 100 and serves as a fixed magnetic layer whose magnetization direction does not change.

The magnetization direction of the first magnetic layer 200 is perpendicular, parallel, or oblique to the surface of the thin film stack. That is, the magnetization direction of the first magnetic layer 200 may have an arbitrary angle with respect to the surface of the thin film stack. In order to fix the magnetization direction, the first magnetic layer 200 is made of a material having a higher magnetic anisotropy energy or a larger coercive force than the second magnetic layer 200.

Specifically, the first magnetic layer 200 contains FeX, CoX, NiX, FeCoX, CoNiX or NiFeX (where X is any one element selected from the group consisting of B, Re, Rh, Cr, Cu, Pt, Pd, Gd, and Tb).

In order for the first magnetic layer 200 to have a magnetization direction perpendicular to the surface of the thin film stack, the first magnetic layer 200 may use a face-centered tetragonal (FCT) metal alloy selected from among FePT, CoPt, FePd, and MnAl, or a metal alloy with a hexagonal close-packed (HCP) structure, which is selected from among $Co_3Pt$ and CoCrPt, or a rare earth transition metal alloy selected from among $Fe_{14}Nd_2B$ and $SmCo_5$, or an interfacial magnetic anisotropy occurring at an CoFeB/MgO interfacial surface, or a multilayer structure selected from among [Co/Pt]n, [CoX alloy/Pt]n, [Co/Pd]n, [CoX alloy/Pd]n, [Co/Ni]n, [CoX alloy/Ni]n, and [Ni/Pt]n in which the n is an integer between 1 to 10 and the X is a metal selected from the group consisting of Fe, Ni, Cr, Ru, Re, Rh, Gd, and Tb.

The perpendicular magnetic anisotropy energy representing the strength of perpendicular magnetic anisotropy can be adjusted with the number of repetitions of a combination of Co and (Pt, Pd, or Ni) or the number of repetitions of a combination of CoX alloy and (Pt, Pd, or Ni). In order to increase the perpendicular magnetic anisotropy, the thickness of the Co layer needs to be optimized. Conversely, it is possible to decrease the perpendicular magnetic anisotropy by increasing the thickness of the Co layer from the optimized range.

The first magnetic layer 200 may have a structure in which the number of repetitions of the Co/(Pt, Pd, or Ni) or the CoX alloy/(Pt, Pd, or Ni) is one. Alternatively, the first magnetic layer 200 may be configured by combining an anti-ferromagnetic material and a ferromagnetic material that are coupled through interfacial exchange coupling. In this case, the first magnetic layer 200 may be a bilayer structure of IrMn/Co, PtMn/Co, or a multilayer structure of IrMn/Co/Ru/Co. Further alternatively, the first magnetic layer 200 may be configured with a synthetic anti-ferromagnetic layer which is composed of a magnetic layer, a nonmagnetic layer, and a magnetic layer arranged in this order. In this case, the first magnetic layer 200 may be a trilayer structure of Co/Ru/Co, or a multilayer structure of [Co/Pt]n/Ru/ [Co/Pt]n.

The first insulating layer 300 is formed between the first magnetic layer 200 and the second magnetic layer 400 and serves as a tunneling barrier 300.

The first insulating layer 300 is made of an oxide such as MgO, $Al_2O_3$, or $TiO_2$. Specifically, the first insulating layer 300 may be made of a metal oxide containing two kinds of metal cations, such as $MgAl_2O_4$ or $MgGa_2O_4$.

When the first insulating layer 300 is made of MgO, a high magnetoresistance ratio can be obtained due to coherent tunneling. The first insulating layer 300 preferably has a thickness of 0.7 nm to 2 nm. When the first tunneling layer 300 is thinner than 0.7 nm, a spin filtering effect is insufficient leading to a low tunneling magnetoresistance (TMR), and there is the risk of leakage current due to occurrence of pin holes. On the other hand, when the first tunneling layer 300 is thicker than 2 nm, the drive voltage is excessively high because the product of resistance (R) and area (A) is large.

The second magnetic layer 400 is formed on the first insulating layer 300. The second magnetic layer 400 serves as a free magnetic layer whose magnetization direction changes according to spin transfer torque. The magnetization direction of the magnetic tunnel junction changes during a writing operation so that magnetic information is recorded and stored.

The magnetization direction of the second magnetic layer 400 is perpendicular to the film plane or in-plane. Alternatively, the magnetization direction of the second magnetic layer 400 may be a direction between the perpendicular direction and the in-plane direction. The second magnetic layer 400 may be made of a material exhibiting lower magnetic anisotropy energy or lower coercive force than the first magnetic layer 200 so that the magnetization direction can be easily changed.

The second magnetic layer 400 is made of a material having a composition containing FeX, CoX, NiX, FeCoX, CoNiX or NiFeX (X is at least one element selected from among B, Re, Rh, Cr, Cu, Pt, Pd, Gd, and Tb).

In addition, in order for the second magnetic layer 400 to have a magnetization direction perpendicular to the surface of the thin film, a face-centered tetragonal (FCT) metal alloy such as FePt, CoPt, FePd, or MnAl is used for the second magnetic layer 400. Alternatively, a metal alloy with a hexagonal close-packed (HCP) structure, such as $Co_3Pt$ or CoCrPt, may be used. Further alternatively, a rare earth transition metal alloy such as $Fe_{14}Nd_2B$ or $SmCo_5$ may be used. Yet further alternatively, interfacial magnetic anisotropy arising at the CoFeB/MgO interface may be used.

The second magnetic layer 400 may be a multilayer thin film such as [Co/Pt]n, [CoX alloy/Pt]n, [Co/Pd]n, [CoX alloy/Pd]n, [Co/Ni]n, [CoX alloy/Ni]n, or [Ni/Pt]n (n is a number between 1 and 10 and X is at least one element selected from the group consisting of Fe, Ni, Cr, Ru, Re, Rh, Gd, and Tb).

Furthermore, for the second magnetic layer 400, the perpendicular magnetic anisotropy energy indicating the degree of perpendicular magnetic anisotropy is determined by the number of repetitions of a multilayer structure of Co/(Pt,Pd,Ni) or a multilayer structure of CoX alloy/(Pt,Pd, Ni). In order to obtain a high perpendicular magnetic anisotropy, it is preferable to optimize the thickness of the Co portion of the multilayer structure. Conversely, in order to obtain a low perpendicular magnetic anisotropy, it is preferable to increase the thickness of the Co portion of the multilayer structure from the optimal thickness range.

The second magnetic layer 400 may be configured with one of the multilayer structures that are described above. However, in order to obtain improved characteristics, the second magnetic layer 400 may be a synthetic-free magnetic layer composed of a magnetic layer (for example, CoFeB), a non-magnetic layer (for example, W), and a magnetic layer (for example, CoFeB) arranged in this order. That is, one example of the synthetic-free magnetic layer is CoFeB/W/CoFeB.

The second magnetic layer 400, the first insulating layer 300, and the first magnetic layer 200 constitute the magnetic tunnel junction layer referred to as the first tunnel junction TJ1. The tunneling magnetoresistance (TMR) of the magnetic tunnel junction layer changes according to the relative magnetization directions of the first magnetic layer 200 and the second magnetic layer 400. Storing of magnetic information can be performed by controlling the relative magnetization directions of the first and second magnetic layers and reading of the magnetic information can be performed on the basis of the tunnel magnetoresistance.

A change in the resistance of the magnetic tunnel junction divided by the magnitude of the resistance of the magnetic tunnel junction with parallel configuration is referred to as a magnetoresistance (MR) ratio. In order to increase a signal-to-noise ratio of an MRAM, it is preferable to increase an MR ratio.

In order to obtain a high MR ratio, coherent tunneling is induced by matching the crystal orientation of the first insulating layer 300 with the crystal orientations of the first magnetic layer 200 and the second magnetic layer 400.

For example, the magnetic tunnel junction layer in which the first insulating layer 300 is made of MgO exhibits a high MR ratio. That is, since the crystal orientation of MgO (002) is the same as the crystal orientation of the first magnetic layer 200 and the second magnetic layer 400, a wave function having a specific symmetry ($\Delta_1$ symmetry) selectively and dominantly passes through the MgO barrier.

That is, in order to obtain a high magnetoresistance ratio, the magnetic layer is required to have a specific crystal orientation. In order for the MgO barrier to cause coherent tunneling in conjunction with an adjacent magnetic layer, it is preferable that the crystal structure of the adjacent magnetic layer is a body-centered cubic (BCC) structure. There are two methods of obtaining BCC magnetic layers.

First, epitaxial growth can be used. That is, a magnetic layer with BCC crystal structure is grown through epitaxial deposition method such as molecular beam epitaxy (MBE). Second, amorphous-to-crystal transition can be used. That is, amorphous magnetic layers (CoFeB) are initially formed on respective surfaces of an MgO barrier and are then thermally annealed so that the amorphous structure is changed into a desired crystal structure. That is, when the CoFeB layers undergo the thermal annealing, B is diffused out of the magnetic layer and the amorphous structure of magnetic layer is transformed into a desired crystal structure. Thus, BCC lattice structure that is coherent with the crystal structure of MgO is formed.

The second insulating layer 500 serving as an electric-field control layer is formed on the second magnetic layer 400. When an electric field is applied to the second insulating layer 500, spontaneous polarization occurs in the second insulating layer.

Due to the spontaneous polarization of the second insulating layer 500, which is attributable to an electric field applied to the second insulating layer 500, a high magnitude of electric field can be applied to the second magnetic layer 400 adjacent to the second insulating layer 500. The electric field applied to the second magnetic layer 400 gives rise to the change of magnetic anisotropy of the second magnetic layer 400.

Figure 2B:
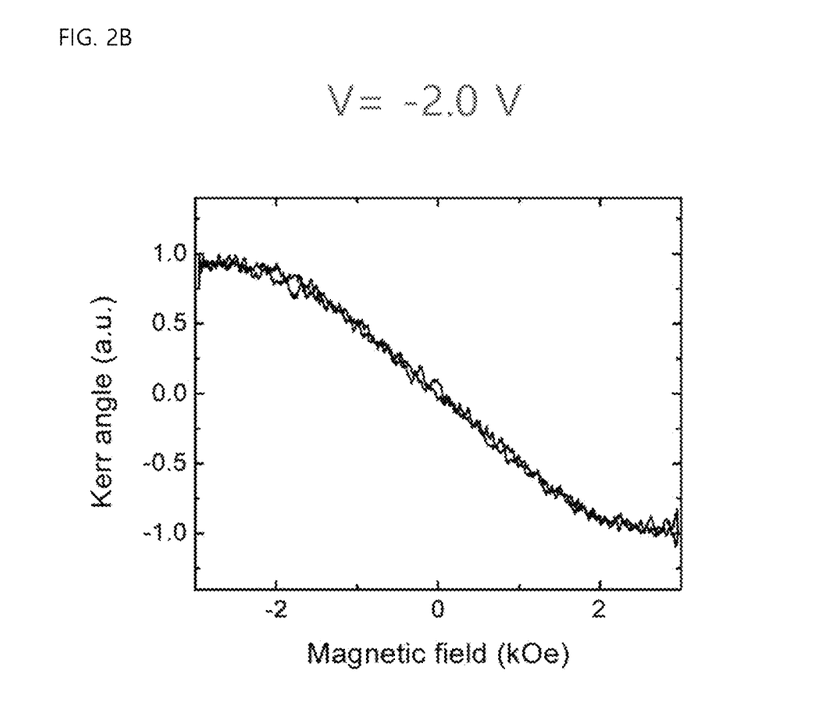
Figure 2C:
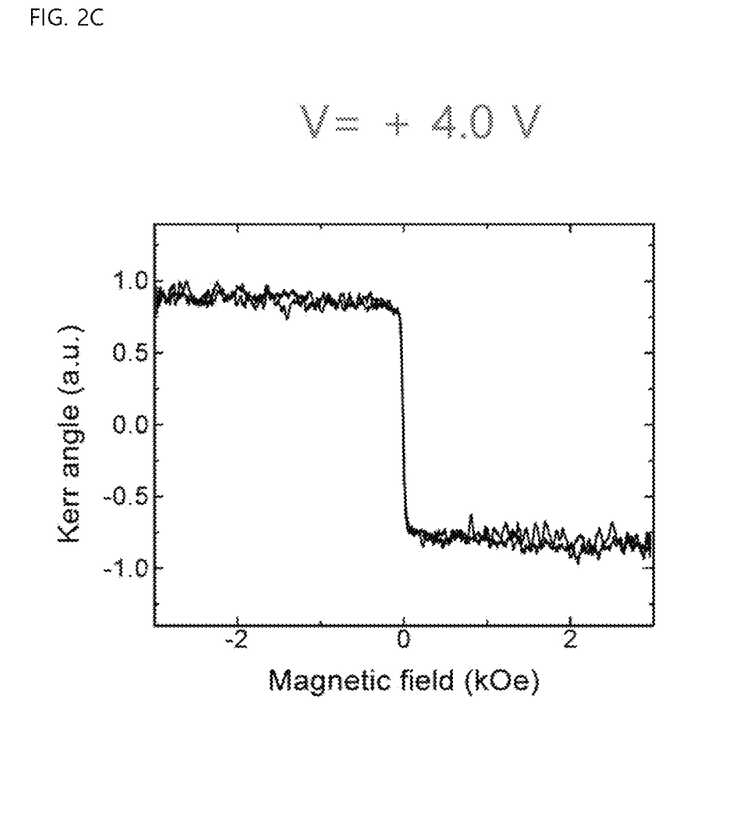

When a negative voltage is applied to the second tunnel junction TJ2 (see FIG. 1A and FIG. 2A) composed of the second electrode layer 700, the second insulating layer 500, and the second magnetic layer 400, the second magnetic layer 400 is magnetized in the in-plane direction (see FIG. 1A and FIG. 2B). By contrast, when a positive voltage is applied to the second tunnel junction TJ2, the second magnetic layer 400 is magnetized in the perpendicular direction (see FIG. 2C). However, depending on the materials of the first tunnel junction TJ1, the direction of the magnetization may be reversed. That is, a positive voltage may cause magnetization in the in-plane direction and a negative voltage may cause magnetization in the perpendicular direction.

In FIG. 2A, a $Ta_2O_5$ layer is an optional layer and functions to protect the second insulating layer from possible damage caused by a voltage application probe. The $Ta_2O_5$ layer is unnecessary for electrical measurement and is not included in the memory cell according to the present disclosure.

The writing operation of magnetic tunnel junction will be described with reference to FIGS. 3A to 3C. The magnetic tunnel junction is initially in parallel configuration in which the first magnetic layer 200 and the second magnetic layer 400 are magnetized in the same direction (for example, perpendicular direction). When no electric field is applied (0 V as shown in FIG. 3A), the two magnetic states corresponding to cases where two magnetic layers are either in parallel or antiparallel configuration are isolated from each other by a high energy barrier $E_b$. In order to write information over this high energy barrier state, a great magnitude of energy is required to overcome the high energy barrier. When a negative voltage is applied so that the second magnetic layer 400 can have an in-plane magnetization direction, an energy barrier Eb between the parallel state and the anti-parallel state is reduced (i.e., −1.0 V as shown in FIG. 3B). In this case, it is possible to switch the magnetization direction with a small current or a small amount of energy. When an electric field is removed, the energy barrier Eb is recovered to the original level which minimizes the effect of thermal fluctuations on the retention of information and thus the recorded information can be stably maintained (0 V as illustrated in FIG. 3C).

Since the change in the magnetic anisotropy energy of the second magnetic layer 400 is proportional to the magnitude of the electric field applied to the second magnetic field 400, although the same voltage is applied, a relatively large change in the magnetic anisotropy energy can be induced in the second magnetic layer 400 due to the effect of spontaneous electric polarization.

Although an electric field applied to the second insulating layer 500 is removed, a ferroelectric state in which electric polarization remains can be used. The material of the second insulating layer 500 contains $HfO_2$ as a main component and Zr, Y, Si, Al, Gd, Tb, Yb, Sr, or La as an additive component. Alternatively, the material of the second insulating layer 500 contains $ZrO_2$ as a main component and Y, Si, Al, Gd, Tb, Yb, Sr, or La as an additive component. Further alternatively, the material of the second insulating layer 500 contains MgO as a main component and Hf, Zr, Y, Si, Al, Gd, Tb, Yb, Sr, La, Ir, Pt, Ru, Ta, Mo, Ti, Zn, or Ga as an additive component. The second insulating layer preferably has an orthorhombic structure (Pca2 space group).

The work-function control layer 600 according to the present disclosure is formed on the second insulation layer 500 and functions to reduce the resistance of the second tunnel junction TJ2 composed of the second electrode layer 700, the second insulating layer 500, and the second magnetic layer 400 arranged in this order.

The work-function control layer 600 may be made of a metal having a work function value equal to or lower than 4 eV, such as Mg, Sc, Sr, Y, Ba, La, Hf, Ce, Nd, Sm, Eu, Gd, Tb, Dy, Ho, Er, Tm, Yb, or Lu.

As illustrated in FIG. 4A, the electric resistance of the tunnel junction is exponentially proportional to the square root of the height $\varphi$ of the tunnel barrier and the thickness d of the tunnel barrier. In order to control the magnetic anisotropy of the second magnetic layer 400 using electric field and spontaneous electric polarization of the second insulating layer 500, the second insulating layer 500 needs to be thicker than at least a certain thickness.

However, when the thickness of the second insulating layer 500 is increased, a problem occurs in which the resistance R2 of the tunnel junction TJ2 (i.e., the second electrode layer 700/the second magnetic layer 400/the second insulating layer 500) becomes higher than the resistance R1 of the magnetic tunnel junction TJ1 (i.e., the second magnetic layer 400/the first insulating layer 300/the first magnetic layer 200). Since the magnitude of a read signal which is resistance that changes according to the magnetic state is proportional to the resistance R1, the read signal decreases by a degree of R1/(R1+R2) when the resistance R2 increases.

As illustrated in FIG. 4B, when the work-function control layer 600 is formed between the second insulating layer 500 and the second electrode layer 700, the height of the tunnel barrier of TJ2 consisting of the second magnetic layer 400, the second insulating layer 500, and the second electrode layer 700 is reduced due to the low work function of the work-function control layer 600. Therefore, it is possible to obtain a moderate resistance of the tunnel junction while increasing the thickness of the tunnel junction. Accordingly, it is possible to make the resistance R1 that determines the magnitude of the signal be higher than the resistance R2.

In addition, the work-function control layer 600 according to the present disclosure is doped with Zr, Y, Si, Al, Gd, Sr, or La in order to obtain a suitable the spontaneous electric polarization of the second insulating layer 500. Alternatively, the work-function control layer 600 made of Zr, Y, Si, Al, Gd, Sr, La, or the like is formed on an $HfO_2$ layer so that a portion of elements contained in the work-function control layer 600 can diffuse into the $HfO_2$ layer. Through this, the second insulating layer changes to have suitable structural and mechanical characteristics so as to serve as the electric-field control layer 500.

For example, when the $HfO_2$ layer is doped with Zr, Y, Al, Gd, Sr, or La, the bond length between each atom is influenced. Thus, the spontaneous electric polarization is enhanced or the orthorhombic structure that is easy to have ferroelectric characteristics is formed. In this case, the spontaneous electric polarization is enhanced in comparison with the pure $HfO_2$.

The second electrode layer 700 is formed on the second insulation layer 500. The second electrode layer 700 is used to provide electric current to the magnetic RAM element from an external power supply. The second electrode layer 700 also enables the second insulating layer 500 to have desirable structural and electrical characteristics. Alternatively, when the work-function control layer 600 is placed on the second insulating layer, the second electrode layer 700 is formed on the work-function control layer 600.

The second electrode layer 700 is made of a metal such as Hf, Ta, W, Re, Os, Ir, Pt, Au, Y, Zr, Nb, Mo, Ru, Th, Pd, Ag, In, Sn, Ti, V, Cr, Mn, Fe, Co, Ni, Cu, Zn, Mg, Al, or Si, a metal alloy (for example, $Ta_xW_{1-x}$) of any one of those metals, a metal nitride (for example, TaN) of any one of those metals, or a combination (for example, Ta/CuN/Ta) of the metal and the metal nitride.

Next, the operation of the magnetoresistive random-access memory (MRAM) according to one embodiment of the present disclosure will be described with reference to FIGS. 1 to 3C.

A writing operation of the MRAM (i.e., operation of changing the magnetization direction of the second magnetic layer 400) is performed by applying a voltage pulse Vo across the first electrode layer 100 and the second electrode layer 700.

The voltage pulse is applied such that a voltage V1 (=Vo·R1/(R1+R2)) is applied to the first tunnel junction (i.e., magnetic tunnel junction) TJ1 composed of the second magnetic layer 400, the first insulating layer 300, and the first magnetic layer 200 arranged in this order and a voltage V2 (=Vo·R2/(R1+R2)) is applied to the second tunnel junction TJ2 composed of the second electrode layer 700, the second insulating layer 500, and the second magnetic layer 400 arranged in this order.

The magnetization reversal caused by spin transfer torque occurs in the first tunnel junction (i.e., magnetic tunnel junction) TJ1 composed of the second magnetic layer 400, the first insulating layer 300, and the second magnetic layer 400 arranged in this order, and a change in the magnetic anisotropy of the second magnetic layer 400, which is caused by an electrical field, occurs in the second tunnel junction TJ2 composed of the second electrode layer 700, the second insulating layer 500, and the second magnetic layer 400 arranged in this order. These two actions simultaneously take place with the same voltage pulse applied.

Next, the process of the magnetization reversal caused by spin transfer torque within the first tunnel junction (i.e., magnetic tunnel junction) TJ1 composed of the second magnetic layer 400, the first insulating layer 300, and the first magnetic layer 200) arranged in this order will be described.

When the first magnetic layer 200 and the second magnetic layer 400 are magnetized in opposite directions and electrons flow from the first magnetic layer 200 to the second magnetic layer 400, a spin-polarized current generated in the first magnetic layer 200 flows into the second magnetic layer 400. Thus, the spin angular momentum of the electrons is transferred to the second magnetic layer 400. When the transferred angular momentum of the electrons exceeds a critical level, the magnetization direction of the second magnetic layer 400 is reversed to be the same as the magnetization direction of the first magnetic layer 200.

Conversely, when the first magnetic layer 200 and the second magnetic layer 400 are magnetized in the same direction and electrons flow from the second magnetic layer 400 to the first magnetic layer 200, electrons having the same spin as that of the first magnetic layer 200 are injected into the first magnetic layer 200 and a portion of electrons having the opposite spin reflects off from the interfacial surface between the first insulating layer 300 and the first magnetic layer 200 and returns to the second magnetic layer 400. These returning electrons apply the spin torque that is opposite to the magnetization of the second magnetic layer 400, thereby reversing the magnetization direction of the second magnetic layer 400 so that the magnetization directions of the two magnetic layers become anti-parallel.

Next, the process in which the magnetic anisotropy of the second magnetic layer 400 is changed by an electric field within the second tunnel junction TJ2 (i.e., the second electrode layer 700/the second insulating layer 500/the second magnetic layer 400) will be described.

When a voltage is applied across the second magnetic layer 400 and the second electrode layer 700, the spontaneous electric polarization of the second insulating layer 500 takes place. When the spontaneous electric polarization of the second insulating layer 500 takes place, a strong electric field proportional to the dielectric constant of the second insulating layer 500 is applied to the second magnetic layer adjacent to the second insulating layer 500. Here, the magnetic anisotropy energy of the second magnetic layer 400 is a function of the magnitude of the electric field applied externally, and a change in the magnetic anisotropy energy is proportional to the magnitude of the total electric field applied to the second magnetic layer.

Therefore, even with the same voltage applied, it is possible to induce a larger change in the magnetic anisotropy energy in the second magnetic layer 400 due to the effect of spontaneous electric polarization. Since the energy used to write the information in the second magnetic layer 400 is proportional to KV (K is density of anisotropic energy and V is the volume of a device), it is possible to considerably reduce the current or energy required to switch the magnetization direction of the second magnetic layer 400 by reducing the K. When the externally applied voltage is removed, the magnetic anisotropy energy is restored to the original level. Therefore, the retention stability of the information is ensured.

On the other hand, when the second insulating layer 500 is made of a strong ferroelectric material, the electric polarization may be maintained even when the external electric field is removed. The stability of the magnetic information stored in the second magnetic layer 400 is proportional to $KV/k_B T$ (where K is the anisotropy energy density, V is the volume of the device, $k_B$ is the Boltzmann constant, and T is the temperature).

That is, at the time of writing information, it is possible to reduce the current or energy used to switch the magnetization direction by reducing the magnetic anisotropy energy (KV). On the other hand, when maintaining the stored information, the retention stability of the stored information can be improved by increasing the magnetic anisotropy energy (KV).

As described above, regarding the MRAM according to the related art, the writing operation (i.e., the switching of the magnetization direction) is performed by using only the spin transfer torque. However, according to the present disclosure, the writing operation of the MRAM is performed by combining the control of an electric field and the control of spin transfer torque. Therefore, the present disclosure has an advantage of reducing the current or energy required for switching of the magnetization direction in the MRAM.

The information reading method for the MRAM according to the embodiment of the present disclosure is similar to that for a conventional MRAM that uses a magnetic tunnel junction and tunnel magnetoresistance. A memory element has a low resistance when the magnetization directions of the free magnetic layer (second magnetic layer) 400 and the fixed magnetic layer (first magnetic layer) 200 are parallel but has a high resistance when the magnetization directions of the free magnetic layer (second magnetic layer) 400 and the fixed magnetic layer (first magnetic layer) 200 are anti-parallel. The low resistance and the high resistance respectively correspond to digital information "0" and digital information "1".

However, when the thickness of the second insulating layer 500 is increased, there is a problem that the resistance R2 of the second tunnel junction TJ2 composed of the second electrode layer 700, the second insulating layer 500, and the second magnetic layer 400 arranged in this order is higher than the resistance R1 of the first tunnel junction TJ1 composed of the second magnetic layer 400, the first insulating layer 300, and the first magnetic layer 200 arranged in this order.

The signal that is a resistance change depending on a magnetic state is proportional to the resistance R1. Therefore, when the resistance R2 is increased, the magnitude of the read signal is decreased by a degree of R1/(R1+R2). When the work-function control layer 600 is formed between the second insulating layer 500 and the second electrode layer 700 according to one embodiment of the present disclosure, the height of the tunnel barrier that is configured with the second electrode layer 700, the second insulating layer 500, and the second magnetic layer 400 is lowered due to the work-function control layer 600 having a low work function value. Therefore, it is possible to obtain a moderate resistance of the tunnel junction although the thickness of the second insulating layer 500 is increased.

Therefore, the resistance R1 that determines the magnitude of the signal can be increased to be higher than the resistance R2.

FIGS. 5 and FIG. 6 schematically illustrate the architecture of an MRAM in which a memory cell is connected to a transistor 901, according to one embodiment of the present disclosure, and the driving method of the MRAM. The memory cell includes a first electrode layer 100, a first magnetic layer 200, a first insulating layer 300, a second magnetic layer 400, a second insulating layer 500, a work-function control layer 600, and a second electrode layer 700. The first electrode layer 100 of the memory cell is connected to the drain D of the transistor 910, and the second electrode 700 is connected to a bit line BL. When a voltage is applied to a word line WL connected to the gate G of the transistor 910, the transistor 910 is turned on. Thus, a voltage pulse can be applied across the first electrode layer 100 and the second electrode layer 700. This voltage pulse switches the magnetization direction of the second magnetic layer 400.

FIGS. 7 and 8 schematically illustrate the architecture of an MRAM in which a memory cell including three electrode layers is connected to a first transistor 910 and a second transistor 920, according to another embodiment of the present disclosure, and the driving method of the MRAM.

This MRAM includes a first electrode layer 100, a first magnetic layer 200, a first insulating layer 300, a second magnetic layer 400, a second insulating layer 500, a second electrode layer 700, ad a third electrode layer 800. The MRAM according to the present embodiment differs from the MRAM according to the former embodiment in that the work-function control layer 600 is omitted and the third electrode layer 800 is added.

The third electrode layer 800 is formed between the first insulating layer 300 and the second insulating layer 500. The third electrode layer 800 is electrically connected to the second magnetic layer 400 and to a connection terminal CT leading to the drain of the second transistor 920. Thus, a voltage can be selectively applied to a first tunnel junction TJ1 composed of the first magnetic layer 200, the first insulating layer, and the second magnetic layer 400 or to a second tunnel junction TJ2 composed of the second magnetic layer 400, the second insulating layer 500, and the second electrode layer 700.

The third electrode layer 800 is formed through steps of: etching the first insulating layer 300, selectively etching the second magnetic layer 400, and forming the third electrode layer 800 on the remaining second electrode layer 400. Alternatively, the third electrode layer 800 may be formed through steps of: etching the first insulating layer 300 and locally doping the second magnetic layer 400 with Ga ions or the like to locally modify the second magnetic layer 400 such that the modified portion of the second magnetic layer becomes a non-magnetic conductor.

Further alternatively, the third electrode layer 800 may be formed through steps of: etching the first one insulating layer 300 and modifying a portion of the second magnetic layer 400 to have a magnetic property different from that of the other portion of the second magnetic layer 400. That is, a locally modified second magnetic layer 400 is formed and a domain wall is formed at the boundary between the original second magnetic layer 400 and the modified second magnetic layer 400.

That is, the case where an additional electrode layer (i.e., third electrode layer) is added and the work-function control layer 600 is omitted has an advantage that the MRAM can be driven by using the second insulating layer 500 having a thickness that is enough to cause spontaneous electric polarization even without using the work-function control layer 600.

Next, the writing operation for the MRAM according to the embodiment (i.e., method of switching the magnetization direction of the second magnetic layer 400) will be described.

In the first tunnel junction TJ1 composed of the second electrode layer 700, the second insulating layer 500, and the second magnetic layer 400 arranged in this order, a voltage pulse V0 is applied across the second electrode layer 700 and the third electrode layer 800 so that the magnetization direction of the second magnetic layer 400 can be changed by an electric field.

Next, another voltage pulse is applied to the first tunnel junction (i.e., the magnetic tunnel junction) composed of the second magnetic layer 400, the first insulating layer 300, and the first magnetic layer 200 arranged in this order via the first electrode layer 100 and the third electrode layer 800 so that the magnetization reversal of the second magnetic layer 400 is caused by the spin transfer torque.

This configuration allows the second insulating layer 500 to have a relatively large thickness in comparison with a conventional MRAM. This relatively thick second insulating layer 500 reliably diminishes electrical conduction, thereby reducing energy consumption of the MRAM. In addition, since a relatively high voltage can be applied to the MRAM, the magnetic anisotropy caused by an electric field can be maximized.

FIG. 9 is a schematic diagram illustrating the architecture of an MRAM in which a plurality of memory cells, each having three electrode layers, is arranged. The multiple memory cells are arranged on the second insulating layer 500 so as to be collectively driven. Reading and writing of information can be selectively performed for each of the memory cells. Alternatively, the memory cells can be simultaneously driven by using one drive transistor (first transistor 910) and second transistors 920 that are respectively connected to the memory cells.

As described above, the present disclosure provides an electric field-controlled magnetoresistive random-access memory (MRAM) having heterogeneous tunnel junctions so that the MRAM can be driven at low power consumption by combining electric field-controlled magnetic anisotropy and spin transfer torque. Thus, the MRAM exhibits high energy efficiency.

According to the present disclosure, it is possible to write information by switching the magnetization direction with a small current or energy by temporarily lowering the energy barrier that determines the retention stability of stored information by using an electric field during the writing operation, and to improve reliability of retention of information during the non-writing operation.

In addition, according to the present disclosure, with the presence of the work-function control layer, it is possible to reduce the resistance of the magnetic tunnel junction and to facilitate the electric polarization of the electric-field control layer, thereby increasing the effect of the electric field-controlled magnetic anisotropy.

In addition, according to the present disclosure, with the presence of the third electrode layer, a relatively thick electric-field control layer can be used. This thick relatively thick electric-field control layer reliably diminishes the flow of an electric current (electric conduction), thereby reducing energy consumption of a memory cell and allowing the application of a high voltage. Therefore, the present disclosure has an advantage of maximizing the effect of electric field-controlled magnetic anisotropy.

What is claimed is:

1. An electric field-controlled magnetoresistive random-access memory (MRAM) comprising at least one one-bit memory cell having a heterogeneous tunnel junction structure composed of a first tunnel junction and a second tunnel junction, wherein:
   the first tunnel junction comprises:
      a first magnetic layer having a fixed magnetization direction;
      a second magnetic layer having a variable magnetization direction that changes according to spin transfer torque when a voltage is applied to the first tunnel junction, thereby providing magnetic information; and
      a first insulating layer provided between the first magnetic layer and the second magnetic layer and serving as a tunnel barrier;
   the second tunnel junction comprises:
      the second magnetic layer; and
      a second insulating layer provided on one surface of the second magnetic layer;
   the first and second tunnel junctions share the second magnetic layer;
   the second tunnel junction has only one magnetic layer being the second magnetic layer;
   the one-bit memory cell has only two magnetic layers being the first magnetic layer and the second magnetic layer, and
   the second insulating layer is formed of a ferroelectric material configured to undergo spontaneous electric polarization when an electric field is applied thereto to control an electric field applied to the second magnetic layer and induce a change in magnetic anisotropy in the second magnetic layer.

2. The MRAM according to claim 1, wherein the one-bit memory cell further comprises:
   a first electrode layer on one surface of which the first magnetic layer is provided; and
   a second electrode layer provided on one side of the second insulating layer.

3. The MRAM according to claim 2, wherein each of the first electrode layer and the second electrode layer is made of any one metal selected from the group consisting of Hf, Ta, W, Re, Os, Ir, Pt, Au, Y, Zr, Nb, Mo, Ru, Th, Pd, Ag, In, Sn, Ti, V, Cr, Mn, Fe, Co, Ni, Cu, Zn, Mg, Al, and Si, a metal alloy based on the any one metal, a metal nitride based on the any one metal, or a combination of the any one metal and the metal nitride.

4. The MRAM according to claim 2, wherein in order to fix the magnetization direction of the first magnetic layer, the first magnetic layer is made of a material having a higher magnetic anisotropy energy or a larger coercive force than the second magnetic layer.

5. The MRAM according to claim 2, wherein each of the first magnetic layer and the second magnetic layer comprises FeX, CoX, NiX, FeCoX, CoNiX, or NiFeX (where X is at least one element selected from the group consisting of B, Re, Rh, Cr, Cu, Pt, Pd, Gd, and Tb).

6. The MRAM according to claim 2, wherein in order for each of the first magnetic layer and the second magnetic layer to have a magnetization direction that is perpendicular to a thin film surface, each of the first magnetic layer and the second magnetic layer uses:
   a face-centered tetragonal (FCT) metal alloy selected from among FePT, CoPt, FePd, and MnAl;
   a metal alloy with a hexagonal close-packed (HCP) structure, selected from among $Co_3Pt$ and CoCrPt;
   a rare earth transition metal alloy selected from among $Fe_{14}Nd_2B$ and $SmCo_5$;
   an interfacial magnetic anisotropy occurring at an CoFeB/MgO interfacial surface; or
   a multilayer thin film selected from among [Co/Pt]n, [CoX alloy/Pt]n, [Co/Pd]n, [CoX alloy/Pd]n, [Co/Ni]n, [CoX alloy/Ni]n, and [Ni/Pt]n (where n is an integer between 1 to 10 and X is a metal selected from the group consisting of Fe, Ni, Cr, Ru, Re, Rh, Gd, and Tb).

7. The MRAM according to claim 2, wherein the first magnetic layer uses a material formed through exchange coupling between an anti-ferromagnet and a ferromagnet or a synthetic anti-ferromagnetic material composed of a magnetic layer, a nonmagnetic metal layer, and a magnetic layer arranged in this order, and
   wherein the second magnetic layer is a synthetic-free magnetic layer composed of a magnetic layer, a nonmagnetic layer, and a magnetic layer arranged in this order.

8. The MRAM according to claim 2, wherein the first type of insulating layer is made of a first metal oxide selected from among MgO, $Al_2O_3$, and $TiO_2$ or a second type of metal oxide including two or more kinds of metal cations and being selected from among $MgAl_2O_4$ and $MgGa_2O_4$.

9. The MRAM according to claim 2, wherein the first insulating layer has a thickness within a range from 0.7 nm to 2 nm.

10. The MRAM according to claim 2, wherein the first tunnel junction has a higher resistance than the second tunnel junction so that a resistance and a magnetoresistance ratio of the memory cell is dominantly determined by the first tunnel junction.

11. The MRAM according to claim 10, wherein coherent tunneling is induced by matching a crystal orientation of the first insulating layer with crystal orientations of the first magnetic layer and the second magnetic layer.

12. The MRAM according to claim 2, wherein the second insulating layer is made of $HfO_2$ doped with at least one element selected from the group consisting of Zr, Y, Si, Al, Gd, Tb, Yb, Sr, and La, or $ZrO_2$ doped with at least one element selected from the group consisting of Y, Si, Al, Gd, Tb, Yb, Sr, and La, or MgO doped with at least one element selected from the group consisting of Hf, Zr, Y, Al, Gd, Tb, Yb, Sr, La, Ir, Pt, Ru, Ta, Mo, Ti, Zn, and Ga.

13. The MRAM according to claim 2, wherein the one-bit memory cell further comprises a non-magnetic work-function control layer interposed between the second insulating layer and the second electrode layer to reduce a resistance of the second tunnel junction.

14. The MRAM according to claim 13, wherein the work-function control layer is made of a metal having a work function lower than 4 eV and being selected from the group consisting of Mg, Sc, Sr, Y, Ba, La, Hf, Ce, Nd, Sm, Eu, Gd, Tb, Dy, Ho, Er, Tm, Yb, and Lu.

15. The MRAM according to claim 13, wherein the work-function control layer is prepared by forming an insertion layer doped with at least one element selected from the group consisting of Zr, Y, Si, Al, Gd, Sr, and La or at least one element selected from the group consisting of Zr, Y, Si, Al, Gd, Sr, and La on an $HfO_2$ layer so that a portion of substances of the insertion layer diffuses into the $HfO_2$ layer, thereby causing spontaneous electric polarization to occur in the second insulating layer.

16. The MRAM according to claim 2, wherein the one-bit memory cell further comprises a non-magnetic third electrode layer that is electrically connected to the second magnetic layer and via which a voltage is connected to the first tunnel junction or the second tunnel junction.

17. The MRAM according to claim 16, wherein the third electrode layer is formed through steps of etching the first insulating layer, selectively etching the second magnetic layer, and forming the third electrode layer on the remaining second magnetic layer, or steps of etching the first insulating layer and locally doping the second magnetic layer to locally remove a magnetic property from the second magnetic layer, or steps of etching the first insulating layer and forming a locally modified second magnetic layer by converting a magnetic property of a portion of the second magnetic layer.

18. The MRAM according to claim 1, wherein the MRAM comprises an array of the memory cells that are arranged to be collectively driven, and wherein information is selectively read out of and written into the memory cells.

* * * * *